US006756922B2

United States Patent
Ossia

(10) Patent No.: US 6,756,922 B2
(45) Date of Patent: Jun. 29, 2004

(54) METHOD AND SYSTEM FOR COMPRESSION OF A SET OF MOSTLY SIMILAR STRINGS ALLOWING FAST RETRIEVAL

(75) Inventor: Yoav Ossia, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 473 days.

(21) Appl. No.: 09/860,759

(22) Filed: May 21, 2001

(65) Prior Publication Data

US 2002/0178156 A1 Nov. 28, 2002

(51) Int. Cl.[7] .................................................. H03M 7/38
(52) U.S. Cl. ........................... 341/51; 341/63; 341/64; 341/76; 341/77; 341/87; 341/106
(58) Field of Search ............................. 341/51, 63–64, 341/76–77, 87, 106

(56) References Cited

U.S. PATENT DOCUMENTS

| | | | | |
|---|---|---|---|---|
| 4,516,246 A | * | 5/1985 | Kenemuth | 375/259 |
| 4,748,638 A | * | 5/1988 | Friedman et al. | 375/222 |
| 4,862,167 A | * | 8/1989 | Copeland, III | 341/107 |
| 5,357,250 A | * | 10/1994 | Healey et al. | 341/107 |
| 5,406,282 A | * | 4/1995 | Nomizu | 341/65 |
| 5,488,365 A | * | 1/1996 | Seroussi et al. | 375/259 |
| 5,635,932 A | * | 6/1997 | Shinagawa et al. | 341/51 |
| 5,748,122 A | * | 5/1998 | Shinagawa et al. | 341/67 |
| 6,061,007 A | * | 5/2000 | Eastty et al. | 341/77 |
| 6,492,920 B2 | * | 12/2002 | Oki et al. | 341/106 |

* cited by examiner

Primary Examiner—Michael Tokar
Assistant Examiner—Khai M. Nguyen
(74) Attorney, Agent, or Firm—Browdy and Neimark, P.L.L.C.

(57) ABSTRACT

A computer implemented method and system for selecting a string for serving as a reference string for a comparison scheme for compressing a set of strings calculates preliminary compression results for every string relative to an initial reference string, and uses the preliminary compression results to find a better reference string without additional compression tests. According to one embodiment, a histogram is calculated showing the number of occurrences of each compressed length for each string in the set plotted against the initial reference string and the better reference string has a length corresponding to an average compression length or center of gravity of the histogram.

21 Claims, 13 Drawing Sheets

| String No. | Data |
|---|---|
| 1 | 1111111111111111110000000000000000000 |
| 2 | 1115111111111111110000000000000000000 |
| 3 | 1115511111111111110000000000000000000 |
| 4 | 1115591111111111110000000000000000000 |
| 5 | 1115511110111111110000000000000000000 |
| 6 | 1115511110011111110000000000000000000 |
| 7 | 1115511110001111110000000000000000000 |
| 8 | 1115511110001111110000000300000000000 |
| 9 | 1115511110001111110000000345600000000 |
| 10 | 1115511110001111110000000345700000000 |
| 11 | 1115511110001111110000000344700000000 |
| 12 | 1115511110001111110000000345780000000 |
| 13 | 1115511110001111110000000345080000000 |
| 14 | 1115511110001111110000000344000000000 |
| 15 | 1115511110001111110000000005700000000 |
| 16 | 1115511110001111110000000000700000000 |
| 17 | 1115511112501111110000000000000000000 |
| 18 | 1115511112111111110000000000000000000 |
| 19 | 1115581111111111110000000000000000000 |

FIG. 1

| String No. | *CompLength* *($S_n,1$)* | Compression Data |
|---|---|---|
| 1 | 0 | |
| 2 | 3 | 3 1 5 |
| 3 | 4 | 3 2 5 5 |
| 4 | 5 | 3 3 5 5 9 |
| 5 | 7 | 3 2 5 5 5 1 0 |
| 6 | 8 | 3 2 5 5 5 2 0 0 |
| 7 | 9 | 3 2 5 5 5 3 0 0 0 |
| 8 | 12 | 3 2 5 5 5 3 0 0 0 14 1 3 |
| 9 | 15 | 3 2 5 5 5 3 0 0 0 14 4 3 4 5 6 |
| 10 | 15 | 3 2 5 5 5 3 0 0 0 14 4 3 4 5 7 |
| 11 | 15 | 3 2 5 5 5 3 0 0 0 14 4 3 4 4 7 |
| 12 | 16 | 3 2 5 5 5 3 0 0 0 14 5 3 4 5 7 8 |
| 13 | 17 | 3 2 5 5 5 3 0 0 0 14 3 3 4 5 1 1 8 |
| 14 | 14 | 3 2 5 5 5 3 0 0 0 14 3 3 4 4 |
| 15 | 13 | 3 2 5 5 5 3 0 0 0 16 2 5 7 |
| 16 | 12 | 3 2 5 5 5 3 0 0 0 17 1 7 |
| 17 | 9 | 3 2 5 5 5 3 2 5 0 |
| 18 | 7 | 3 2 5 5 5 1 2 |
| 19 | 5 | 3 3 5 5 8 |

FIG. 3

| Length | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| LengthHist$_1$ | 1 | 0 | 0 | 1 | 1 | 2 | 0 | 2 | 1 | 2 | 0 | 0 | 2 | 1 | 1 | 3 | 1 | 1 |
| LengthRep$_1$ | 1 | | | 2 | 3 | 4 | | 5 | 6 | 7 | | | 8 | 15 | 14 | 9 | 12 | 13 |

FIG. 4

| Length | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| $LengthHist_7$ | 2 | 1 | 2 | 2 | 3 | 2 | 4 | 1 | 1 | 1 | 0 | 0 | 0 | 0 | 0 | 0 | 0 | 0 |
| $LengthRep_7$ | 7 | 6 | 5 | 8 | 4 | 3 | 2 | 12 | 13 | 1 | | | | | | | | |

FIG. 6

| Length | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| $LengthHist_1$ | 1 | 0 | 0 | 1 | 1 | 2 | 0 | 2 | 1 | 2 | 0 | 0 | 2 | 1 | 1 | 3 | 1 | 1 |
| $LengthRep_1$ | 1 | | | 2 | 3 | 4 | | 5 | 6 | 7 | | | 8 | 15 | 14 | 9 | 12 | 13 |
| $SumI$ | 1 | 2 | 3 | 4 | 5 | 6 | 6 | 7 | 5 | 5 | 5 | 5 | 4 | 7 | 8 | 7 | 6 | 5 |

FIG. 9

| Length | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| LengthHist$_{14}$ | 1 | 4 | 3 | 1 | 0 | 2 | 1 | 2 | 0 | 2 | 1 | 1 | 0 | 0 | 1 | 0 | 0 | 0 |
| LengthRep$_{14}$ | 14 | 15 | 8 | 13 | | 7 | 6 | 5 | | 4 | 3 | 2 | | | 1 | | | |

FIG. 10

| String No. | Comp Length (l,1) | Estimated Results | | | Actual Results | | |
|---|---|---|---|---|---|---|---|
| | | Comp Length (l,Rp) | Comp Length (l,Rs) | Used | Comp Length (l,Rp) | Comp Length (l,Rs) | Used |
| 1 | 0 | 14 | 7 | 7 | 14 | 7 | 7 |
| 2 | 3 | 11 | 4 | 4 | 13 | 6 | 6 |
| 3 | 4 | 10 | 3 | 3 | 10 | 3 | 3 |
| 4 | 5 | 9 | 2 | 2 | 13 | 6 | 6 |
| 5 | 7 | 7 | 0 | 0 | 9 | 0 | 0 |
| 6 | 8 | 6 | 1 | 1 | 8 | 3 | 3 |
| 7 | 9 | 5 | 2 | 2 | 5 | 4 | 4 |
| 8 | 12 | 2 | 5 | 2 | 4 | 7 | 4 |
| 9 | 15 | 1 | 8 | 1 | 4 | 10 | 4 |
| 10 | 15 | 1 | 8 | 1 | 4 | 10 | 4 |
| 11 | 15 | 1 | 8 | 1 | 3 | 10 | 3 |
| 12 | 16 | 2 | 9 | 2 | 5 | 11 | 5 |
| 13 | 17 | 3 | 10 | 3 | 6 | 12 | 6 |
| 14 | 14 | 0 | 7 | 0 | 0 | 9 | 0 |
| 15 | 13 | 1 | 6 | 1 | 6 | 8 | 6 |
| 16 | 12 | 2 | 5 | 2 | 6 | 7 | 6 |
| 17 | 9 | 5 | 2 | 2 | 9 | 5 | 5 |
| 18 | 7 | 7 | 0 | 0 | 10 | 3 | 3 |
| 19 | 5 | 9 | 2 | 2 | 13 | 6 | 6 |
| Estimated Total | | | 36 | Actual Total | | | 81 |
| Best Possible total Using string 3 as Primary reference and string 10 as Secondary reference | | | | | | | 64 |

FIG. 12

| Group | Method 1 steps | Method 2 steps | Characteristics |
|---|---|---|---|
| Initial compression and Histogram creation | Figs. 3 to 5 | Figs. 3 to 5 | Expensive |
| Calculations on the histogram | Figs. 6, 7 | Figs. 10, 11 | Cheap |
| Final Actual Compression | | | Expensive |

US 6,756,922 B2

METHOD AND SYSTEM FOR COMPRESSION OF A SET OF MOSTLY SIMILAR STRINGS ALLOWING FAST RETRIEVAL

FIELD OF THE INVENTION

This invention relates to data compression of mostly similar strings.

BACKGROUND OF THE INVENTION

To store sets of mostly similar strings supporting fast retrieval of randomly selected members, one method is to represent each string with its difference from a set-fixed reference string (which is usually also a member of the set). This representation will result in compression when the string is sufficiently similar to the reference. Thus, choosing a good reference string is central to the quality of compression when such a storage method is used. Given a set of N strings, selecting the best reference string among them requires an order of $N^2$ compression tests. Such a selection technique, especially in large sets of strings, is lengthy.

DEFINTIONS AND OBJECTIVES

For any compression method, there are a few parameters that may be defined:

CompLength($S_c$, $S_r$)—if $S_r$ is the reference string and $S_c$ a string to be compressed, then CompLength($S_c$, $S_r$) is the length of the compressed representation of $S_c$ with respect to $S_r$.

TotalLength($S_r$)—is the total length of the compressed representation of all the strings in the set, when they are compressed using $S_r$ as the reference string.

SUMMARY OF THE INVENTION

The object of the invention is to easily find such a string, $S_r$, so TotalLength ($S_r$) is minimal.

This object is realized in accordance with a broad aspect of the invention by a computer implemented method for selecting a string for serving as a reference string for a comparison scheme for compressing a set of strings, the method comprising the following steps:

(a) calculating preliminary compression results for every string relative to an initial reference string, and (b) using the preliminary compression results to find a better reference string without additional compression tests.

According to one embodiment of the invention, there is provided a computer implemented method for selecting a string for serving as a reference string for a comparison scheme for compressing a set of strings, the method comprising the following steps:

(a) compressing the set of strings against a selected initial reference string so as to produce a set of compressed strings, (b) determining a histogram of the costs of all strings in the set of compressed strings showing for each different length of string in the set of compressed strings a frequency of occurrence in the set, and an identity of at least one string whose compression length equals said different length, and (c) using said histogram to determine a better reference string.

The invention is based on the heuristic assumption that:

if CompLength ($S_1$, $S_r$)–CompLength ($S_2$, $S_r$)=δ
Then CompLength ($S_1$, $S_2$)≈δ

In other words, a subset of strings that are different from a reference string by similar degrees will probably be compressed at a lower cost if one of them is chosen as the reference string instead. It is therefore possible to predict the results of compression with one reference string based on the actual result of compressing it with another.

The invention uses the above heuristic assumption in order to predict a good reference string or strings. There are several ways of utilizing this idea, but all are based on the same principle of calculating preliminary compression results for every string relative to an arbitrary chosen string, and then using these results to find, with very small computational cost and without additional compression tests, a better reference string.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 1 is a table listing a set of 19 strings that are to be compressed according to the invention;

FIG. 3 is a table showing the compressed data and the compression of each string when compressed relative to an initial reference string using a specific example of a compression method;

FIGS. 4 and 5 are histograms showing respectively in tabular and pictorial format the frequency of occurrence for each different compression length when compressed relative to the first string;

FIGS. 6 and 7 are histograms showing respectively in tabular and pictorial format the frequency of occurrence for each different compression length when compressed relative to the seventh string;

FIG. 9 is a table showing the compression data relating to each string when compressed relative to an initial reference string;

FIGS. 10 and 11 are histograms showing respectively in tabular and pictorial format the frequency of occurrence for each different compression length when compressed relative to the fourteenth string;

FIG. 12 is a table showing calculated data relating to two-stage compression.

DETAILED DESCRIPTION OF SPECIFIC EMBODIMENTS

Figure 2:
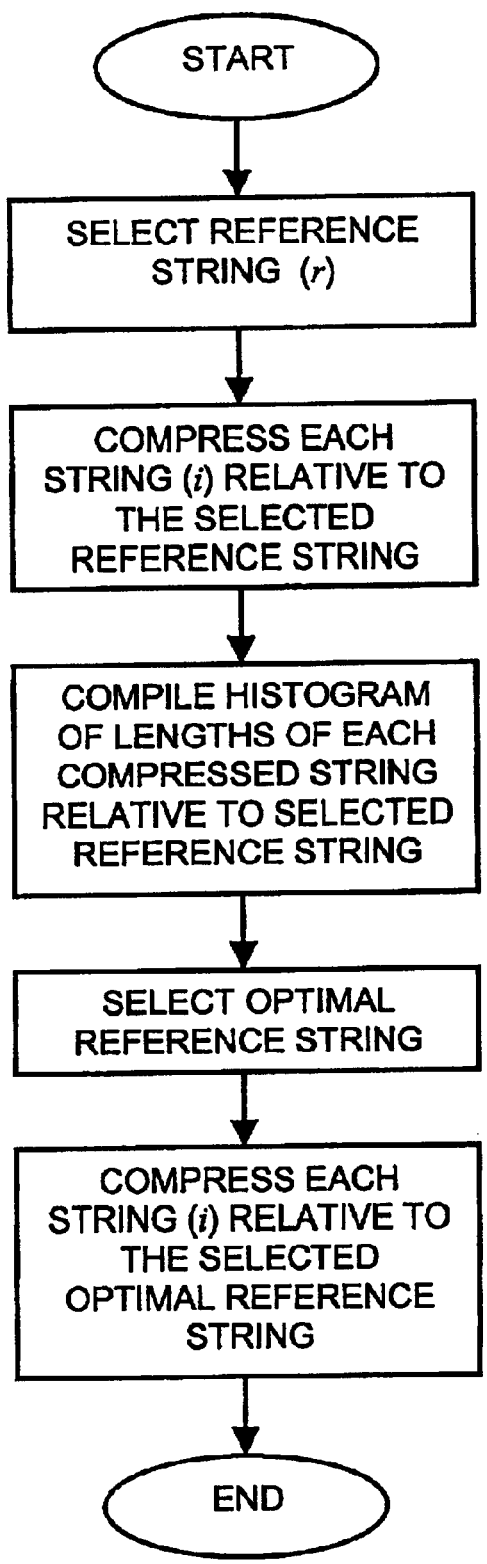
FIG. 2 is a flow diagram showing the principal operating steps associated with a method according to a first embodiment the invention.

There are now described two different methods for selecting the best reference string in a set of strings $S_c$ containing 19 strings as shown in FIG. 1. The strings are of similar length and contain numbers ranging from 0 to 9. It will be appreciated that this example was chosen for ease of explanation, and the invention is equally applicable for more complicated cases.

In order to understand these methods, there needs to be defined a way of storing compression results:

LengthHist$_r$—is a histogram of compression results using S$_r$ as the reference string. LengthHist$_r$(i) is the number of strings whose CompLength(Si$_1$, S$_r$) is i.

LengthRep $_r$—is a vector that for each possible string length i, stores the index j of a string S$_j$ whose CompLength(S$_j$, S$_r$) is i. Such string is the Representative String of the length. In a preferred implementation, only one string is stored. If there is no such string at all, LengthRep$_r$ (i) has a special value (for example −1).

By way of explanation, the strings are compressed using a compression scheme sometimes that is known for compressing sets of strings that are usually similar. According to this scheme, for each string in the set there are recorded the number of similar numbers in each string, the number of different numbers and then the different numbers themselves. This sequence is repeated as long as there are different numbers. If the tail of the two strings is similar, there is no need to record it.

For example, if the string:
1115511111000111111100000003000000000000
is to be compressed relative to
1111111111111111111110000000000000000000
then it is seen that it has 3 similar numbers (111) then 2 different numbers: 5 5. Then there are 5 similar numbers (11111) followed by 3 different numbers: 0 0 0. After that, there are 14 similar numbers then 1 different number: 3. The rest of the string is similar to the reference string. So the compressed string is:
3 2 5 5 5 3 0 0 0 14 1 3

In order to better demonstrate this compression method, the reference string, the original string, and the compressed string are shown together. The compressed string is spaced, so that the actual different numbers that were taken from the original string are placed in their original locations, and printed (in all 3 strings) in bold typeface.
Reference String: 1111111111111111111110000000000000000000
Original String: 1115511111000111111100000003000000000000
Compressed data: 3 255 5 3 000 14 1 3

Method 1: Selecting the Best Single Reference String

FIG. 2 is a flow diagram showing the principal operating steps associated with a method according to a first embodiment the invention for selecting an optimum reference string against which to compress the strings in the set of strings shown in FIG. 1.

An initial reference string is first selected. This string may be either any string from the set, or a randomly selected (for example the first, last of middle), or a string that is not even part of the set, or even a synthetic string (for example the all-zero string). Once the initial reference string is selected, the compression is calculated for each string in the set, and the histogram LengthHist$_r$ and the vector LengthRep$_r$ are compiled as shown in FIGS. 3 and 4, respectively.

Each location in the vector LengthRep$_r$ has a different value equal to the index of a string whose compression length is equal to the respective location in the vector. For example, the third location in the vector points to a string whose length is 3, and so on. The string pointed to by each value in the vector LengthRep$_r$ is referred to as the representative string for the associated compression length. In the case that more than one string in the set gives rise to the same compression length, the first matching string is selected as the representative string such that the index of the first matching string is written to the vector LengthRep$_r$. In the case that no string in the set gives rise to the compression length equal to the current index of the vector LengthRep$_r$, the value of the current index is set to an impossible value, such as 1, indicating that there is no representative string for the compression length equal to this index.

FIG. 3 is a table that lists the compression results of the above set of strings, when compressed relative to the first string. Thus, for example, it is seen that the compression length of the second string is 3; the compression length of the eighth string is 12; the compression length of the ninth, tenth and eleventh strings is 15, and so on. The total compression length of all the compressed strings is 186 and is denoted by TotalLength(1) showing the total compression length when the strings are compressed relative to string number 1 in the set.

Figure 5:
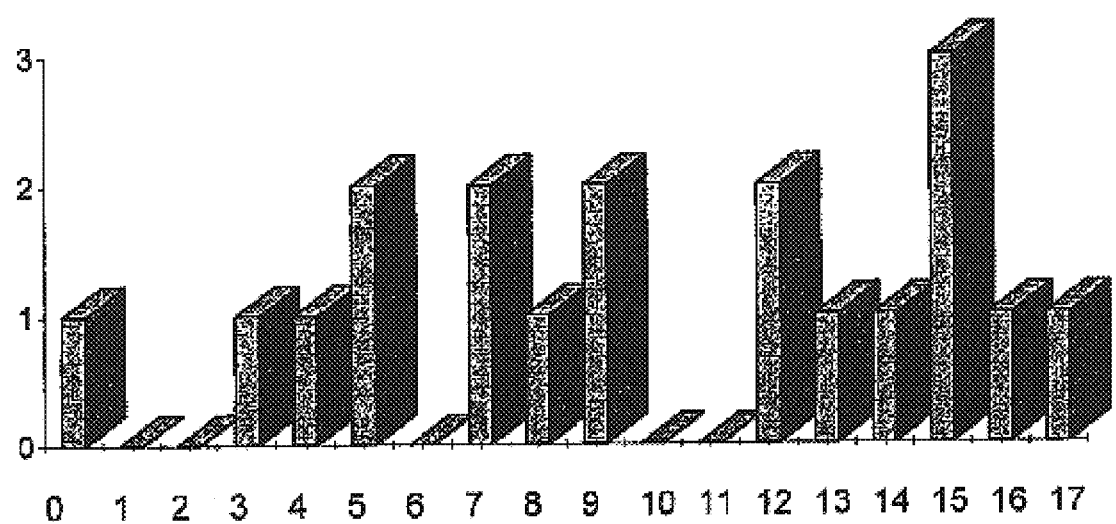

FIGS. 4 and 5 are histograms showing in tabular form and pictorially frequency of occurrence for each different compression length. It is immediately apparently from FIG. 5 that three strings have a length of 15, two strings have lengths of 5, 7, 9 and 12 and seven strings have lengths of 3, 4, 8, 13, 14, 16 and 17. The heuristic assumption mentioned above suggested that if a string is selected whose length is of a minimal distance from the length of all other strings, then this string is the best reference string. The length that is selected is the center of gravity of the above histogram and is calculated by:

$$\frac{\sum_{i=1}^{N} i \times LengthHist_1(i)}{N}$$

If the resulting length has no occurrences (i.e. its histogram value is 0) then the nearest non-empty length is selected instead. In the above example, the result is 186/19=10, which has no representative string, and therefore length 9 is selected. As seen in FIG. 4, the representative string having a length of 9 is string 7.

As a result of selecting as a reference string a string whose compressed length is L, the method according to the invention estimates that all strings in the original histogram whose compressed length is L will be compressed to zero, and for any offset, X, all strings whose compressed length was L−X, or L+X will be compressed to length X. The estimated histogram that is the result of this calculation, may be used to calculate the estimated TotalLength( ). For the calculation of the estimated LengthRep, the representative of an estimated length X is either the representative of the L−X, or L+X length in the original histogram.

FIG. 6 is a table showing the estimated histogram, and LengthRep, when using string 7 as the reference string. The estimation is based on the original histogram shown in FIGS. 4 and 5 and requires no further compression of any of the strings in the set of strings shown in FIG. 1. Thus, the two strings 7 and 17 whose original compression lengths are 9 may be expected, after compression against string 7, to have a compression length of zero. String 6 is the only string that has an original compressed length of 8, and after compression against string 7, its compressed length may be expected to be 1. Strings 5 and 18 both have an original compressed length of 7. Therefore their compressed lengths after compression against string 7 may be expected to be 2.

Figure 7:
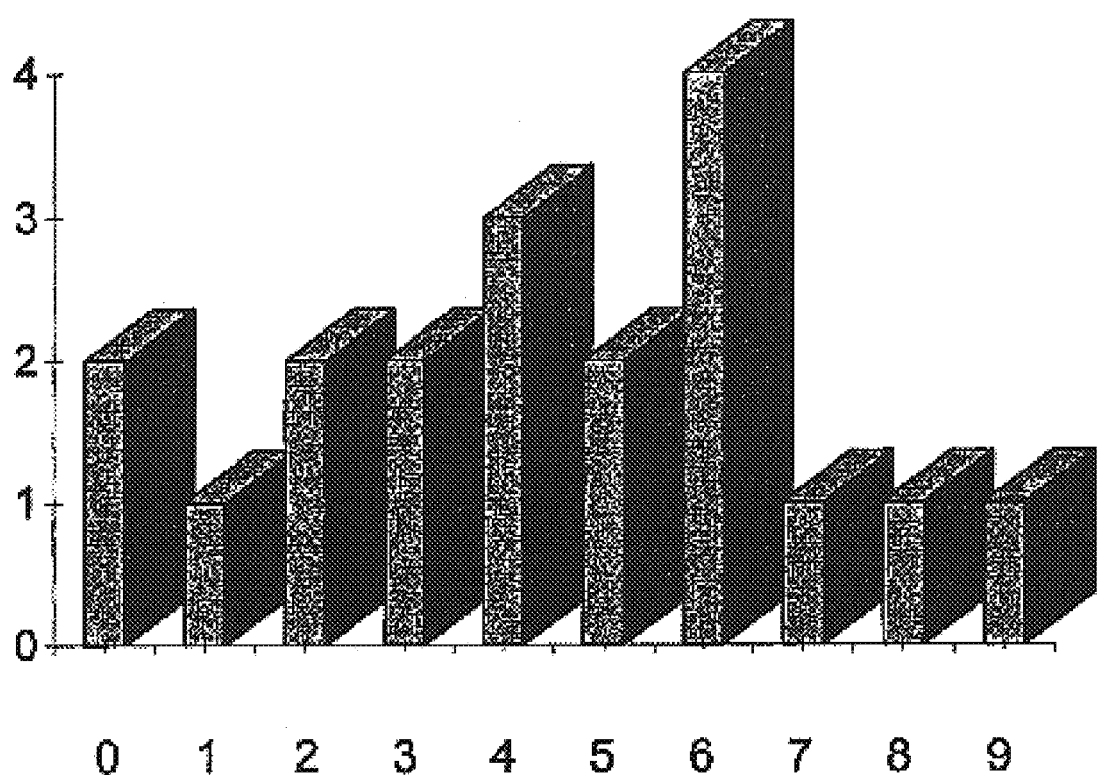

It thus emerges that merely by analyzing the histogram shown in FIGS. 4 and 5 in this manner, it is possible to construct a new estimated histogram showing the compressed lengths of all the strings when compressed against string 7. The resulting estimated histogram is shown in tabular form in FIG. 6, from which it emerges immediately that, after compression against string 7, the strings are estimated to have compressed lengths ranging from 0 to 9 as opposed to the range 0 to 17 when compressed against the first string. It is also clear that the average compressed length is less than the original average and this can be seen more clearly from the pictorial form of the estimated histogram shown in FIG. 7. The total length, TotalLength (7), of the compressed strings when compressed against string 7 is estimated as 81 and compares with an actual value of 102. That is, compressing against the estimated optimal representative string produces an actual degree of compression that is less than the estimation, but usually close to the real optimal selection. In the present case, the value of 102 is actually the optimal value, since there is no other string that will produce better results.

Method 2: Selecting a Primary and Secondary Reference Strings

It will be noticed that for some string sets, selecting a reference string as described in the above-described method will not result in a satisfactory compression. This will happen when the set contains a few different groups of strings. In such case it is desirable to select a separate reference string for each such group. The advantage of such an approach is that better compression is achieved within each group. The disadvantage is the extra cost of storing, for each compressed string, the identity of its reference string. This extra cost is usually of a fixed size (of coding the index of the reference string) per each member of the set.

Such a method will now be described for selecting two reference strings, it being understood that the method may be extended to more reference strings.

Figure 8:
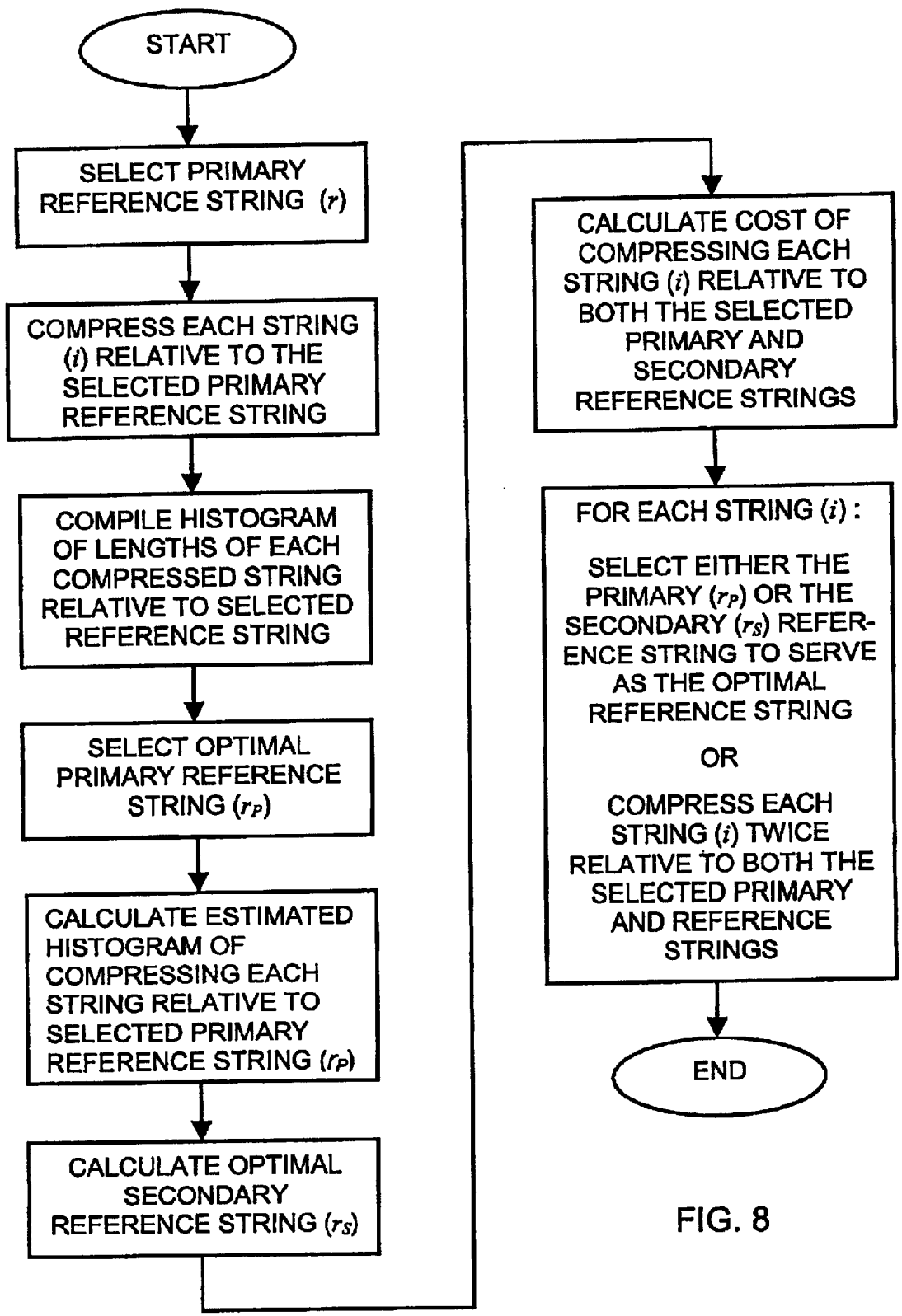
FIG. 8 is a flow diagram showing the principal operating steps associated with a method according to a second embodiment of the invention.

FIG. 8 shows the principal steps associated with such a method for selecting primary and secondary reference strings. At the final actual compression step, each string in the set is compressed twice (once for each reference string) and the better compression is used. Thus, as in the first method, there is initially selected a preliminary reference string against which all the strings in the set are compressed. So, if using the example set of string shown in FIG. 2, the resulting compression is shown in FIG. 2 and the histogram is shown in tabular and pictorial form in FIGS. 4 and 5, respectively. The optimal primary reference (Rp) string is now calculated. Here the purpose is to select a string that will serve as a good reference string to the most dominant group of strings in the set. So a different method is required to that described above with reference to FIG. 2. Instead of calculating the center of gravity of the histogram, the method may search for the peak of the biggest group in the histogram. For example, the following algorithm may be used:

1. Select a range X to be ¼ of the histogram's size.
2. For each i calculate SUMi that is:

LengthHist$_r$(i−X/2)+LengthHist$_r$(i−X/2+1)+ . . . +LengthHist$_r$(i)+ LengthHist$_r$(i+1)+ . . . +LengthHist$_r$(i+X/2)

3. Select the i, whose SUMi is maximal, as the length of the primary reference. Select the LengthRep(i) string to be the primary reference string.

FIG. 9 is the replication of FIG. 3, with the addition of showing also the calculation of SUMi when X equals 5. The string length that is selected is 14 and the representative string is string 14. So the Primary reference string (Rp) is string 14.

The estimated result of using the selected string (Rp) as reference string is now calculated. This step is similar to what is described above with reference to FIG. 2, using the primary reference string 14 as selected above.

Figure 11:
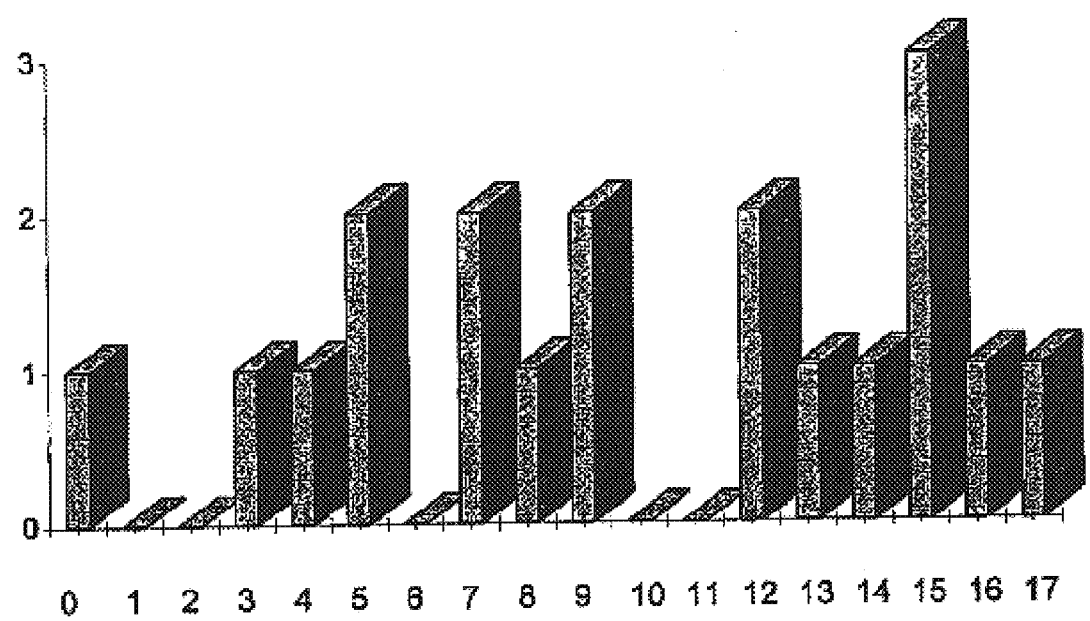

The estimated histogram showing the frequency of occurrence for each resulting compression length is shown in tabular and pictorial form in FIGS. 10 and 11, respectively.

The optimal secondary reference (Rs) string is now calculated using the estimated histogram shown in FIGS. 10 and 11. It is now necessary to find a string that will minimize the cost of compression, for all stings that cannot be sufficiently compressed using the primary reference string. This may be done in the same way as described above with reference to FIGS. 2, 4 and 5 where the optimal reference string was derived from the center of gravity of the histogram. But since it is required to minimize the cost of compression only for "not-so-well-compressed" strings, the algorithm calculates the center of gravity only for strings that are estimated to still have a compression length above a given threshold. For example, if we select this threshold to be ⅓ of the total number of strings, then the calculation will sum LenghtHist$_{14}$ from a specified lower limit, LowLimit as long as this sum is less than ⅓ of the string set. LowLimit is assigned the index in the histogram where this sum had reached the required threshold.

From this LowLimit, the center of gravity is calculated as follows:

$$\frac{\sum_{i=LowLimit}^{N} i \times LengthHist_{14}(i)}{\frac{2}{3} \cdot N}$$

Again, if the result is a length that has no occurrences (i.e. its histogram value is 0) then the nearest non-empty length is selected instead.

In our example the size to ignore is 6, and compression lengths 0, 1 and 2 are ignored. The length that is selected is 7 and the Secondary reference string (Rs) is string 5.

The actual compression length of all strings relative to the initial reference string $S_r$ was calculated above in the first example and is shown in tabular form in FIG. 3 (where $S_r$ is $S_1$). Since these results are already available, it may be estimated for each string how it would be compressed relative to the two reference strings, and the estimation for the best reference string selected for each compressed string. In other words, since CompLength (Rp, $S_r$) and CompLength(Rs, $S_r$) are known, then for every string $S_i$ in the set:

The estimated cost of compression when using the Primary_reference (Rp) is:

Primary estimation=CompLength($Rp$, $S_r$)−CompLength($S_i$, $S_r$)

The estimated cost of compression when using the Secondary_reference (Rs) is:

Secondary estimation=CompLength($Rs$, $S_r$)−CompLength($S_i$, $S_r$)

These values may be negative so their absolute values must be taken. For each $S_i$, the minimal estimation out of these two is selected and the corresponding reference string is used. Summing all the minimal estimations of all the strings yields the estimated cost for using the selected primary and secondary reference strings. In the example this estimated total length is 36.

The selected reference strings are now used to compress all the set. This is the final step, and will obviously result in a compression that is poorer than the estimation, but usually close to the real optimal selection.

Each string may be compressed twice: once using the primary reference string, and once using the secondary reference string. Each compression may have a different cost (length), and the minimal one is used. Alternatively, in order to save compression effort, the reference string with the minimal estimated cost is directly used for the final compression.

With the example data, the real TotalLength( ), when using string 14 as the primary reference string and string 5 as the secondary, is 81. But it is almost the optimal value. When testing all possible combinations of primary and secondary reference strings (and this takes an order of $N^3$ compressions) the best TotalLength( ) was 64, and it was achieved by using strings 3 and 10 as reference strings.

FIG. 12 is a table showing all the data that is calculated in the above two steps: for every string, its compression using the initial reference string, the estimated lengths of the two compressions (with Rp, Rs and the selected reference string), the actual lengths of the two compressions, and the actual selected length.

Method 3: Combining Methods 1 and 2

As can be seen, both the above methods have some steps that are computationally expensive and others that are cheap. The steps can be divided into 3 chronologically ordered groups as listed in FIG. 13.

Since the step of selecting a preliminary reference string and compressing the whole set relative to the selected preliminary reference string is common to both methods and all steps till the final compression are cheap, it is possible to create a hybrid method as will now be described. This method will compress the strings either against a single reference string or against two (or more) reference strings, after estimating which is optimal for the given set of strings. Its computational cost is similar to that of the method that originally led to the selected final step.

Thus, initially a preliminary reference string is selected against which the complete set is compressed. This corresponds to the first step of the methods described above. So, if the set of strings shown in FIG. 1 is used, its resulting compression and histogram are shown in FIGS. 3, 4 and 5. Thereafter, all the calculations of Method 1 are performed. That is, the reference string is selected, and the total length TotalLength ($S_r$) is estimated. As described above, with the example set of strings, the selected string is string 7 and the estimated TotalLength($S_7$) is 81.

Thereafter, all the calculations of Method 2 are performed. That is, the primary reference string Rp and the secondary reference string Rs are selected and the total length when using these reference strings is calculated. With the example set of strings, the selected primary reference is string 14, the secondary reference is string 5 and the estimated total length is 36. However, in practice, the set of string may contain more than two different groups of strings. In either case, there will exist for each string in each group a respective per-string primary and second reference string. The per-string primary and second reference string that gives rise to the lower compression length will serve as the per-string preferred reference string.

Taking into account the storage overhead of Method 2, it must now be decided whether to use a single reference, or the primary and secondary references. This method has two overheads:

Computational Final step needs two compressions per each string, in order to find the optimal reference string. This computational overhead may be spared, at the cost of lesser compression quality.

Storage There must be stored in association with each compressed string the identity of the reference string against which it is compressed.

So the decision whether to use a single reference string, or primary and secondary reference strings, is based on the trade-off between these overheads and the estimated improvement in total compression, when using Method 2. This having been done, the actual compression is performed using either the single reference string calculated in the first method or the two (or more) reference strings calculated in the second method.

Figures 13, 14:
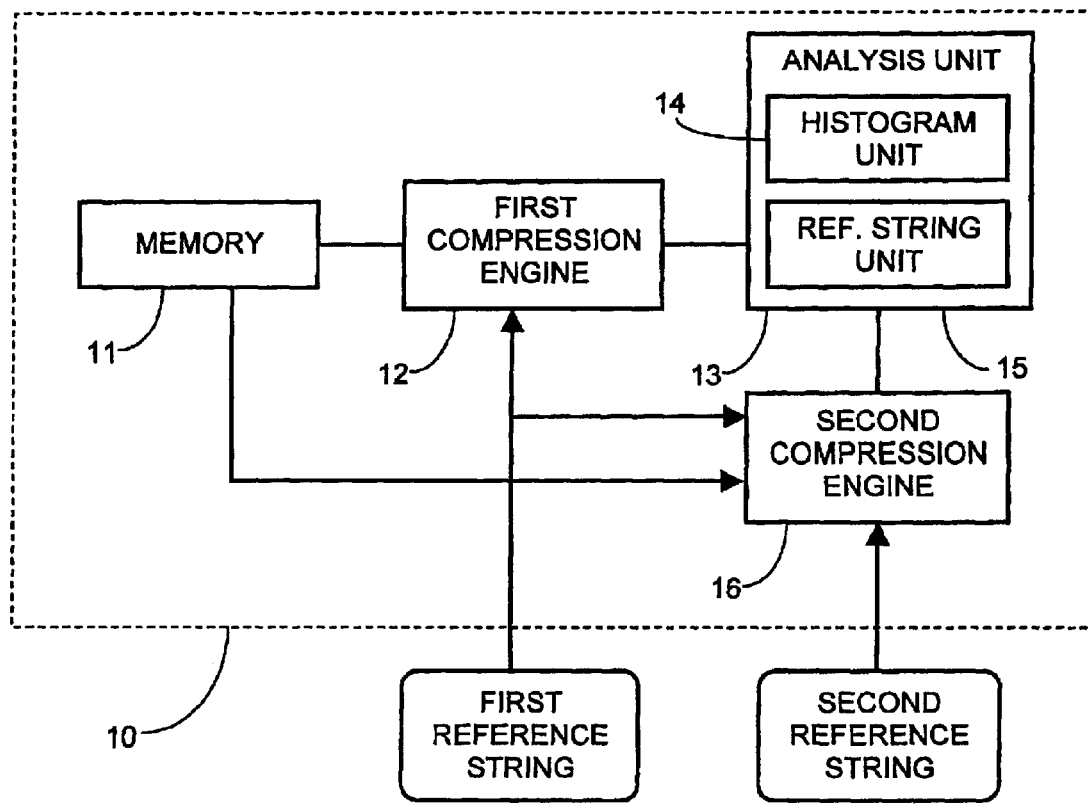
FIG. 13 is a table summarizing the cost overheads associated with the methods depicted in FIGS. 2 and 8.
FIG. 14 is a block diagram showing functionally a system according to the invention.

FIG. 14 shows functionally a system 10 comprising a memory 11 for storing a set of strings, such as shown in FIG. 1. A first compression engine 12 is coupled to the memory 11 and receives as input a first reference string against which all the strings in the set are compressed and stored. An analysis unit 13 is coupled to the first compression engine 12 and includes a histogram unit 14 for creating a histogram showing for each unique compressed string length the number of strings that compress thereto, using the first reference string. The analysis unit 13 further includes a reference string unit 14 for analyzing the histogram and determining therefrom the best representative string, typically corresponding to the first string in the set whose length is equal to the center of gravity of the histogram.

A second compression engine 16 is coupled to the analysis unit 13 and to the memory 11 and may receive one or more second reference strings for compressing the strings in the set as explained above with reference to FIGS. 2 to 13 of the drawings.

It will be apparent that modifications may be made to the specific embodiments, without departing from the scope of the invention as defined in the claims. In particular, it is to be noted that the actual compression technique is not itself a feature of the invention. In the preferred embodiments, compression is performed against an initial reference string that is a member of the set of strings to be compressed and is selected arbitrarily. However, the initial reference string need not be a member of the string set and in any case it can be selected according to any criteria, not necessarily arbitrarily.

In the preferred embodiments, the representative string was taken to be the first string in the set having a specified compressed length. However, it is equally possible to store the corresponding identity of all strings and their corresponding compressed length, and to use some method to select a single representative having a specified compressed length.

In the invention, a better reference string is obtained by determining the center of gravity of the histogram. However, other means may also be employed for analyzing the histogram. For example, the length with maximal number of occurrences could be selected.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

In the method claims that follow, alphabetic characters used to designate claim steps are provided for convenience only and do not imply any particular order of performing the steps.

What is claimed is:

1. A computer implemented method for selecting a string for serving as a reference string for a comparison scheme for compressing a set of strings, the method comprising the following steps:
   (a) calculating preliminary compression results for every string relative to an initial reference string, and
   (b) using the preliminary compression results to find a better reference string without additional compression tests.

2. The method according to claim 1, including prior to step (a):
   i) arbitrarily selecting said initial reference string.

3. A computer implemented method for selecting a string for serving as a reference string for a comparison scheme for compressing a set of strings, the method comprising the following steps:
   (a) compressing the set of strings against an initial reference string so as to produce a set of compressed strings,
   (b) determining a histogram of the costs of all strings in the set of compressed strings showing for each different length of string in the set of compressed strings a frequency of occurrence in the set, and an identity of at least one string whose compression length equals said different length, and
   (c) using said histogram to determine a better reference string.

4. The method according to claim 3, including prior to step (a):
   i) arbitrarily selecting said initial reference string.

5. The method according to claim 3, wherein step (c) comprises:
   i) determining an average column in the histogram indicating the respective length of the string in the compressed set of strings having the greatest frequency of occurrence, and
   ii) selecting one string in said column if said column is not empty or a string in a non-empty column proximate thereto as the reference string.

6. The method according to claim 3, wherein step (c) comprises:
   i) selecting a portion of the histogram that is most heavily populated,
   ii) selecting a string from the center of the most heavily populated portion of the histogram if not empty or a non-empty column proximate thereto,
   iii) using the selected string as a primary reference deriving an estimated histogram as it would appear had the primary reference been used as the compression reference string,
   iv) using the estimated histogram in order to determine at least one secondary reference string,
   v) compressing each string in the set of strings using both the primary reference string and each secondary reference string so as to generate a respective first and at least one second compressed string, and
   vi) for each of the first and second compressed strings, selecting whichever is shorter or either one if they are of identical length.

7. The method according to claim 3, wherein step (c) comprises:
   i) selecting a portion of the histogram that is most heavily populated,
   ii) selecting a string from the center of the most heavily populated portion of the histogram if not empty or a non-empty column proximate thereto,
   iii) using the selected string as a primary reference deriving an estimated histogram as it would appear had the primary reference been used as the compression reference string,
   iv) using the estimated histogram in order to determine at least one secondary reference string, and
   v) selecting an estimated optimal primary or secondary reference string against which to compress the strings.

8. The method according to claim 6, wherein step (i) includes:
   (1) calculating the center of gravity only for strings that are estimated to still have a compression length above a given threshold.

9. A computer implemented method for selecting a string for serving as a reference string for a comparison scheme for compressing a set of strings, the method comprising the following steps:
   (a) compressing the set of strings against an initial reference string so as to produce a set of compressed strings,
   (b) determining a histogram of the costs of all strings in the set of compressed strings showing for each different length of string in the set of compressed strings a frequency of occurrence in the set, and an identity of at least one string whose compression length equals said different length,
   (c) determining an average column in the histogram indicating the respective length of the string in the compressed set of strings having the greatest frequency of occurrence,
   (d) selecting one string in said column as a first selected string if said column is not empty or a string in a non-empty column proximate thereto as the reference string,
   (e) estimating a cost for compressing relative to the first selected reference string,
   (f) selecting a portion of the histogram that is most heavily populated,
   (g) selecting a string from the center of the most heavily populated portion of the histogram if not empty or a non-empty column proximate thereto,
   (h) using the selected string as a primary reference deriving an estimated histogram as it would appear had its primary reference been used as the compression reference string,
   (i) using the estimated histogram in order to determine a secondary reference string,
   (j) estimating a cost for compressing each string in the set of strings using both the primary reference string and the secondary reference string so as to generate a respective first and second compressed string,
   (k) for each of the primary and secondary reference strings, selecting as a respective per string preferred reference string whichever is shorter or either one if they are of identical length,
   (l) estimating a cost for compressing each string using the respective per string preferred reference string, and
   (m) selecting the first selected string against which to compress all the strings or selecting for each string the respective per string preferred reference string against which to compress the respective string depending on which has the lower estimated cost.

10. The method according to claim 9, including prior to step (a):
    i) arbitrarily selecting said initial reference string.

11. A system for selecting a string for serving as a reference string for a comparison scheme for compressing a set of strings, the system comprising:
   a memory for storing said set of strings,
   a first compression engine coupled to the memory for compressing all of the strings in said set relative to an initial reference string,
   an analysis unit coupled to the first compression engine for calculating preliminary compression results for every string relative to the initial reference string, and
   a second compression engine coupled to the analysis unit for using the preliminary compression results to find a better reference string without additional compression tests.

12. The system according to claim 11, wherein the analysis unit includes a histogram unit for determining a histogram of the costs of all strings in the set of compressed strings showing for each different length of string in the set of compressed strings a frequency of occurrence in the set having said different length, and is adapted to use said histogram to determine a better reference string.

13. The system according to claim 12, wherein the analysis unit is adapted to:
   i) determine an average column in the histogram indicating the respective length of the string in the compressed set of strings having the greatest frequency of occurrence, and
   ii) select one string in said column if said column is not empty or a string in a non-empty column proximate thereto as the reference string.

14. The system according to claim 12, wherein the analysis unit is adapted to:
   i) select a portion of the histogram that is most heavily populated,
   ii) select a string from the center of the most heavily populated portion of the histogram if not empty or a non-empty column proximate thereto,
   iii) use the selected string as a primary reference deriving an estimated histogram as it would appear had the primary reference been used as the compression reference string,
   iv) use the estimated histogram in order to determine at least one secondary reference string,
   v) compress each string in the set of strings using both the primary reference string and each secondary reference string so as to generate a respective first and at least one second compressed string, and
   vi) for each of the first and second compressed strings, select whichever is shorter or either one if they are of identical length.

15. The system according to claim 12, wherein the analysis unit is adapted to:
   i) select a portion of the histogram that is most heavily populated,
   ii) select a string from the center of the most heavily populated portion of the histogram if not empty or a non-empty column proximate thereto,
   iii) use the selected string as a primary reference deriving an estimated histogram as it would appear had the primary reference been used as the compression reference string,
   iv) use the estimated histogram in order to determine at least one secondary reference string, and
   v) select an estimated optimal primary or secondary reference string against which to compress the strings.

16. The system according to claim 14, wherein the analysis unit is adapted to calculate the center of gravity only for strings that are estimated to still have a compression length above a given threshold.

17. The system according to claim 12, wherein the analysis unit is adapted to:
   (a) compress the set of strings against an initial reference string so as to produce a set of compressed strings,
   (b) determine a histogram of the costs of all strings in the set of compressed strings showing for each different length of string in the set of compressed strings a frequency of occurrence in the set, and an identity of at least one string whose compression length equals said different length,
   (c) determine an average column in the histogram indicating the respective length of the string in the compressed set of strings having the greatest frequency of occurrence,
   (d) select one string in said column as a first selected string if said column is not empty or a string in a non-empty column proximate thereto as the reference string,
   (e) estimate a cost for compressing relative to the first selected reference string,
   (f) select a portion of the histogram that is most heavily populated,
   (g) select a string from the center of the most heavily populated portion of the histogram if not empty or a non-empty column proximate thereto,
   (h) use the selected string as a primary reference deriving an estimated histogram as it would appear had its primary reference been used as the compression reference string,
   (i) use the estimated histogram in order to determine at least one secondary reference string,
   (j) estimate a cost for compressing each string in the set of strings using both the primary reference string and the at least one secondary reference string so as to generate a respective first and at least one second compressed string,
   (k) for each of the primary and secondary reference strings, selecting as a respective per string preferred reference string whichever is shorter or either one if they are of identical length,
   (l) estimating a cost for compressing each string using the respective per string preferred reference string, and
   (m) selecting the first selected string against which to compress all the strings or selecting for each string the respective per string preferred reference string against which to compress the respective string depending on which has the lower estimated cost.

18. A computer implemented program storage device readable by machine, tangibly embodying a program of instructions executable by the machine to perform method steps for selecting a string for serving as a reference string for a comparison scheme for compressing a set of strings, the method comprising the following steps:
   (a) calculating preliminary compression results for every string relative to an initial reference string, and
   (b) using the preliminary compression results to find a better reference string without additional compression tests.

19. A computer implemented computer program product comprising a computer useable medium having computer readable program code embodied therein for selecting a string for serving as a reference string for a comparison scheme for compressing a set of strings, the computer program product comprising:

computer readable program code for receiving an initial reference string and causing the computer to calculate preliminary compression results for every string relative to the initial reference string, and computer readable program code for causing the computer to use the preliminary compression results to find a better reference string without additional compression tests.

20. A computer implemented program storage device readable by machine, tangibly embodying a program of instructions executable by the machine to perform method steps for selecting a string for serving as a reference string for a comparison scheme for compressing a set of strings, the method comprising the following steps:

(a) compressing the set of strings against an initial reference string so as to produce a set of compressed strings, (b) determining a histogram of the costs of all strings in the set of compressed strings showing for each different length of string in the set of compressed strings a frequency of occurrence in the set, and an identity of at least one string whose compression length equals said different length, (c) determining an average column in the histogram indicating the respective length of the string in the compressed set of strings having the greatest frequency of occurrence, (d) selecting one string in said column as a first selected string if said column is not empty or a string in a non-empty column proximate thereto as the reference string, (e) estimating a cost for compressing the first selected reference string, (f) selecting a portion of the histogram that is most heavily populated, (g) selecting a string from the center of the most heavily populated portion of the histogram if not empty or a non-empty column proximate thereto, (h) using the selected string as a primary reference deriving an estimated histogram as it would appear had its primary reference been used as the compression reference string, (i) using the estimated histogram in order to determine a secondary reference string, (j) estimating a cost for compressing each string in the set of strings using both the primary reference string and the secondary reference string so as to generate a respective first and second compressed string, (k) for each of the primary and secondary reference strings, selecting as a respective per string preferred reference string whichever is shorter or either one if they are of identical length, (l) estimating a cost for compressing each string using the respective per string preferred reference string, and (m) selecting the first selected string against which to compress all the strings or selecting for each string the respective per string preferred reference string against which to compress the respective string depending on which has the lower estimated cost.

21. A computer implemented computer program product comprising a computer useable medium having computer readable program code embodied therein for selecting a string for serving as a reference string for a comparison scheme for compressing a set of strings, the computer program product comprising:

computer readable program code for causing the computer to compress the set of strings against an initial reference string so as to produce a set of compressed strings, computer readable program code for causing the computer to determine a histogram of the costs of all strings in the set of compressed strings showing for each different length of string in the set of compressed strings a frequency of occurrence in the set, and an identity of at least one string whose compression length equals said different length, computer readable program code for causing the computer to determine an average column in the histogram indicating the respective length of the string in the compressed set of strings having the greatest frequency of occurrence, computer readable program code for causing the computer to select one string in said column as a first selected string if said column is not empty or a string in a non-empty column proximate thereto as the reference string, computer readable program code for causing the computer to estimate a cost for compressing the first selected reference string, computer readable program code for causing the computer to select a portion of the histogram that is most heavily populated, computer readable program code for causing the computer to select a string from the center of the most heavily populated portion of the histogram if not empty or a non-empty column proximate thereto, computer readable program code for causing the computer to us the selected string as a primary reference deriving an estimated histogram as it would appear had its primary reference been used as the compression reference string, computer readable program code for causing the computer to use the estimated histogram in order to determine a secondary reference string, computer readable program code for causing the computer to estimate a cost for compressing each string in the set of strings using both the primary reference string and the secondary reference string so as to generate a respective first and second compressed string, computer readable program code for causing the computer to select as a respective per string preferred reference string for each of the primary and secondary reference strings, whichever is shorter or either one if they are of identical length, computer readable program code for causing the computer to estimate a cost for compressing each string using the respective per string preferred reference string, and computer readable program code for causing the computer to select the first selected string against which to compress all the strings or to select for each string the respective per string preferred reference string against which to compress the respective string depending on which has the lower estimated cost.

* * * * *